(12) United States Patent (10) Patent No.: US 12,677,093 B2
Wang (45) Date of Patent: Jul. 7, 2026

(54) EQUALIZER PARAMETER SETTING METHOD, AUDIO DEVICES, AND READABLE STORAGE MEDIUM

(71) Applicant: Anker Innovations Technology Co., Ltd., Changsha (CN)

(72) Inventor: Yong Wang, Shenzhen (CN)

(73) Assignee: Anker Innovations Technology Co., Ltd., Changsha (CN)

(*) Notice: Subject to any disclaimer, the term of this patent is extended or adjusted under 35 U.S.C. 154(b) by 156 days.

(21) Appl. No.: 18/432,652

(22) Filed: Feb. 5, 2024

(65) Prior Publication Data

US 2024/0276148 A1 Aug. 15, 2024

(30) Foreign Application Priority Data

Feb. 15, 2023 (CN) .......................... 202310120130.8

(51) Int. Cl.
H04R 3/04 (2006.01)
H03G 5/02 (2006.01)
(52) U.S. Cl.
CPC .............. H04R 3/04 (2013.01); H03G 5/025 (2013.01)
(58) Field of Classification Search
CPC ............. H04R 3/06; H04R 3/04; H03G 5/025
USPC ............................................ 381/103, 98–99
See application file for complete search history.

(56) References Cited

U.S. PATENT DOCUMENTS

| | | | | |
|---|---|---|---|---|
| 11,611,800 B2 * | 3/2023 | Renner | .................... | H04R 5/04 |
| 12,081,833 B2 * | 9/2024 | Renner | ................. | H03G 5/165 |
| 12,185,068 B2 * | 12/2024 | Shih | ........................ | H03G 5/005 |
| 12,207,063 B2 * | 1/2025 | Chen | ......................... | H04R 3/04 |
| 12,307,161 B1 * | 5/2025 | Liao | .......................... | G06F 3/165 |
| 2016/0197591 A1 * | 7/2016 | Greenwood | ........... | H03G 5/165 |
| | | | | 381/103 |

FOREIGN PATENT DOCUMENTS

| | | |
|---|---|---|
| CN | 114089899 A | 2/2022 |
| CN | 114286257 A | 4/2022 |

* cited by examiner

*Primary Examiner* — Disler Paul
(74) *Attorney, Agent, or Firm* — Banner & Witcoff, Ltd.

(57) ABSTRACT

This application discloses an equalizer parameter setting method, an audio system, a device, and a readable storage medium. A computing device receives an initial equalizer population; and iteratively selects a first equalizer curve and a second equalizer curve from the initial equalizer population. An audio device selects, based on user preference data, the first equalizer curve or the second equalizer curve as a target equalizer curve. The computing device determines an iterative equalizer population based on the target equalizer curve to acquire an iterative target equalizer curve. After determining a number of iterations reaches a preset value, the computing device determines the final iterative target equalizer curve, and causes the audio device to set the corresponding equalizer parameters based on the final iterative target equalizer curve. This application iteratively selects based on the initial equalizer population, and utilizes a group evolution strategy to achieve a reduction in the search space range, improve convergence speed, and enhance the accuracy of matching between final set equalizer parameters and user preference data.

20 Claims, 8 Drawing Sheets

S11 — Obtain the initial equalizer population

S12 — Obtain the first and second equalizer curves from the initial equalizer population S13 — Based on user preference data, determine whether the first equalizer curve or the second equalizer curve is the target equalizer curve S14 — Based on the target equalizer curve, obtain the iterative equalizer population to acquire the iterative target equalizer curve S15 — When the number of iterations reaches the preset number, obtain the final iterative target equalizer curve and set the corresponding equalizer parameters based on the final iterative target equalizer curve

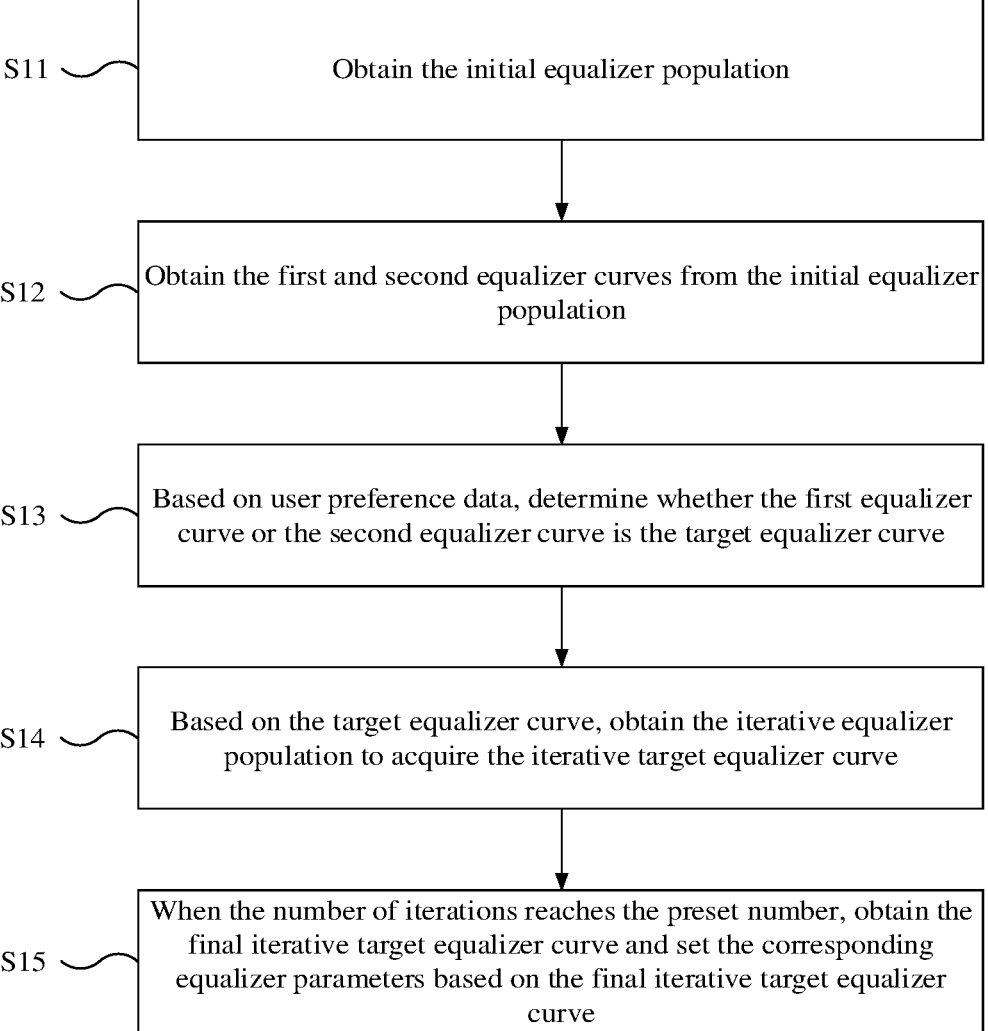

S11  Obtain the initial equalizer population

S12  Obtain the first and second equalizer curves from the initial equalizer population S13  Based on user preference data, determine whether the first equalizer curve or the second equalizer curve is the target equalizer curve S14  Based on the target equalizer curve, obtain the iterative equalizer population to acquire the iterative target equalizer curve S15  When the number of iterations reaches the preset number, obtain the final iterative target equalizer curve and set the corresponding equalizer parameters based on the final iterative target equalizer curve

FIG.1

S141 — Based on the target equalizer curve and the weighting coefficient, calculate the weighted centroid curve of the target equalizer curve S142 — Based on the weighted centroid curve and the initialized equalizer population, obtain the iterative equalizer population

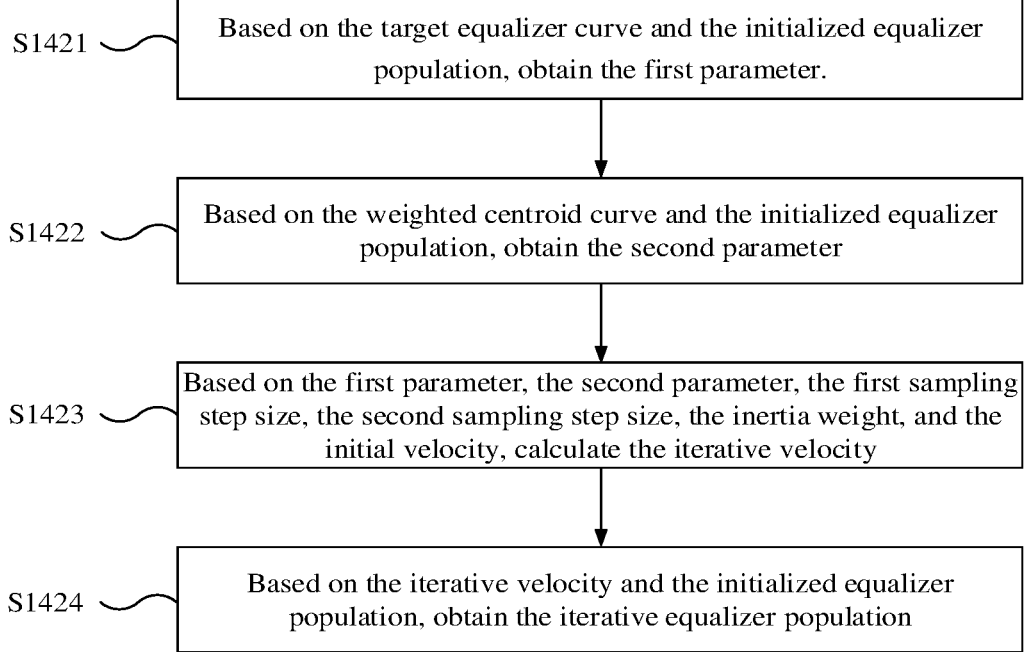

S1421 — Based on the target equalizer curve and the initialized equalizer population, obtain the first parameter.

S1422 — Based on the weighted centroid curve and the initialized equalizer population, obtain the second parameter S1423 — Based on the first parameter, the second parameter, the first sampling step size, the second sampling step size, the inertia weight, and the initial velocity, calculate the iterative velocity S1424 — Based on the iterative velocity and the initialized equalizer population, obtain the iterative equalizer population

FIG. 3

S151 — Obtain the first weight value based on the final iterative target equalizer curve and the first weight parameter S152 — Obtain the second weight value based on the weighted centroid curve and the second weight parameter S153 — Calculate the sum of the first weight value and the second weight value to obtain the set equalizer curve

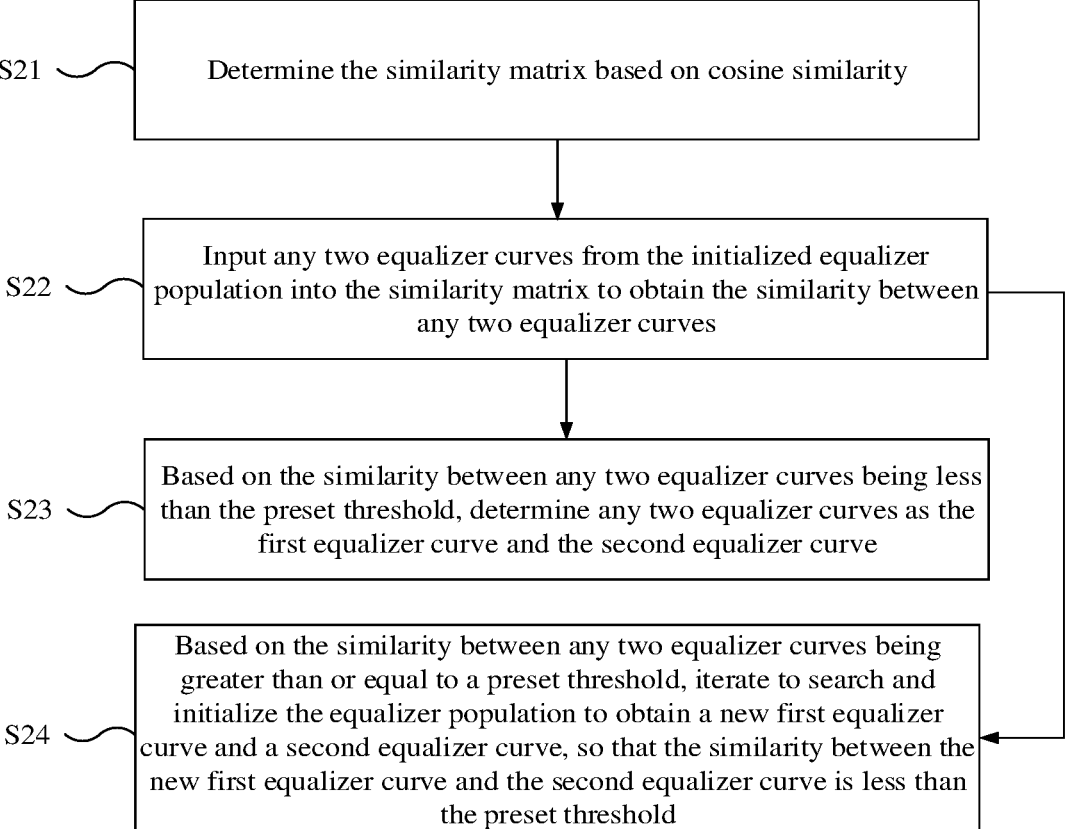

S21 — Determine the similarity matrix based on cosine similarity

S22 — Input any two equalizer curves from the initialized equalizer population into the similarity matrix to obtain the similarity between any two equalizer curves S23 — Based on the similarity between any two equalizer curves being less than the preset threshold, determine any two equalizer curves as the first equalizer curve and the second equalizer curve S24 — Based on the similarity between any two equalizer curves being greater than or equal to a preset threshold, iterate to search and initialize the equalizer population to obtain a new first equalizer curve and a second equalizer curve, so that the similarity between the new first equalizer curve and the second equalizer curve is less than the preset threshold

EQUALIZER PARAMETER SETTING METHOD, AUDIO DEVICES, AND READABLE STORAGE MEDIUM

CROSS-REFERENCE TO RELATED APPLICATION

The present application claims priority to CN Application No. 202310120130.8, filed on Feb. 15, 2023. The above application is incorporated by reference in its entirety.

FIELD

This application relates to the field of audio equipment technology, particularly to an audio equalizer parameter setting method, audio system, device, and readable storage medium.

BACKGROUND

With the development of communication technology, users can not only make calls and send text messages through mobile devices such as mobile phones, but can also play music through such mobile terminals. Adjusting the sound effects of music can be achieved by adjusting the parameters of an equalizer. An equalizer (EQ) is an electronic device that can independently adjust the amplification level of various frequency components in electrical signals. By adjusting the electrical signals of different frequencies, it compensates for the deficiencies of speakers and acoustic fields, and corrects and modifies various sound sources and other specific effects.

Typically, in order to provide users with a better audio experience, manufacturers of mobile devices independently or simultaneously set up audio equalizers in the music players of mobile terminals in one or both of the following modes for users to adjust the player's sound effects. The first mode is the fixed frequency band gain mode audio equalizer, which has significant limitations and can hardly meet the needs of all users. The second mode is the customizable frequency band gain mode audio equalizer, which is relatively complex to adjust, and ordinary users, even if they are aware of their preferences, find it difficult to adjust an audio equalizer to match their preferences.

SUMMARY

This application describes methods for setting equalizer parameters, audio systems, devices, and readable storage media to address the above problems in the existing technology.

The first aspect of this application provides a method for setting equalizer parameters, which comprises: receiving an initial equalizer population an initial equalizer population comprising a plurality of equalizer curves, wherein the plurality of equalizer curves correspond to equalizer parameters of a plurality of dimensions; iteratively select, from the plurality of equalizer curves, a first equalizer curve and a second equalizer curve until a final iterative target equalizer curve is determined, wherein the similarity between the first equalizer curve and the second equalizer curve is less than a preset threshold; receive, from an audio device, a selection of the first equalizer curve or the second equalizer curve as a target equalizer curve, wherein the target equalizer curve is selected by the second control module and based on user preference data; determine, based on the target equalizer curve, an iterative equalizer population; determine, based on the iterative equalizer population, an iterative target equalizer curve; after determining that a number of iterations reaches a preset value, determine the final iterative target equalizer curve; and cause, by the computing device and based on the final iterative target equalizer curve, the audio device to set the corresponding equalizer parameters.

Optionally, the step of determining an iterative equalizer population based on the target equalizer curve comprises:

Determining a weighted centroid curve of the target equalizer curve based on the target equalizer curve and a weighting coefficient;

Determining an iterative equalizer population based on the weighted centroid curve and the initial equalizer population.

Optionally, the step of determining the iterative equalizer population based on the weighted centroid curve and the initial equalizer population comprises:

Determining a first parameter based on the target equalizer curve and the initial equalizer population; wherein the first parameter comprises differences between the target equalizer curve and the remaining equalizer curves in the initial equalizer population;

Determining a second parameter based on the weighted centroid curve and the initial equalizer population; wherein the second parameter comprises differences between the weighted centroid curve and the remaining equalizer curves in the initial equalizer population;

Determining the iterative velocity based on the first parameter, the second parameter, the first sampling step size, the second sampling step size, the inertia weight, and the initial velocity; and Determining the iterative equalizer population based on the iterative velocity and the initial equalizer population.

Optionally, the step of causing the audio device to set the corresponding equalizer parameters based on the final iterative target equalizer curve comprises:

Determining a first weight value based on the final iterative target equalizer curve and a first weight parameter;

Determining a second weight value based on the weighted centroid curve and a second weight parameter; wherein the sum of the first weight parameter and the second weight parameter is equal to one;

Determining the sum of the first weight value and the second weight value to obtain the set equalizer curve; wherein all equalizer parameters in the set equalizer curve are the corresponding equalizer parameters.

Optionally, the step of determining the first equalizer curve and the second equalizer curve from the initial equalizer population, where the similarity between the first equalizer curve and the second equalizer curve is less than a preset threshold, comprises:

Determining the similarity matrix based on cosine similarity;

Inputting any two equalizer curves from the initial equalizer population into the similarity matrix to obtain the similarity between any two equalizer curves;

Based on the similarity between any two equalizer curves being less than the preset threshold, determining any two equalizer curves as the first equalizer curve and the second equalizer curve.

Optionally, the preset number of iterations is between 4-12 times.

Optionally, the preset threshold is progressively reduced based on the number of iterations, or the preset threshold is a fixed constant, where the preset threshold is greater than zero and less than 1.

The second aspect of this application provides an audio system, which comprises a communication device (e.g., a computing device) and an audio device. The communication device comprises a first control module and a first audio module. The audio device comprises a second control module and a second audio module;

The first control module is used to obtain an initial equalizer population; where the initial equalizer population comprises multiple equalizer curves, and the equalizer curves comprise equalizer parameters of multiple dimensions;

The first control module is also used to obtain the first equalizer curve and the second equalizer curve from the initial equalizer population; where the similarity between the first equalizer curve and the second equalizer curve is less than a preset threshold;

The first audio module is used to send the first equalizer curve and the second equalizer curve to the second audio module;

The second audio module is used to receive the first equalizer curve and the second equalizer curve;

The second control module is used to determine the first equalizer curve or the second equalizer curve as the target equalizer curve based on user preference data.

The first control module is also used to communicate with the second control module to obtain the target equalizer curve through the second control module, to acquire the iterative equalizer population based on the target equalizer curve, and to obtain the iterative target equalizer curve based on the iterative equalizer population;

The second control module is also used to obtain the final iterative target equalizer curve when the number of iterations reaches the preset number, and to set the corresponding equalizer parameters based on the final iterative target equalizer curve.

The third aspect of this application provides an electronic device that comprises a memory and a processor that are coupled to each other. The processor is used to execute program instructions stored in the memory to implement the equalizer parameter setting method described above.

The fourth aspect of this application provides a computer-readable storage medium that stores a computer program. The computer program, when executed by a processor, implements the equalizer parameter setting method described above.

The beneficial effect of this application is that, unlike the existing technology, this application is based on the iterative selection of an initial equalizer population and iteratively updates the equalizer population to output the final iterative target equalizer curve when the number of iterations reaches the preset threshold. Based on the final iterative target equalizer curve, the corresponding equalizer parameters are set. Using a group evolution strategy, it is possible to reduce the search space, improve convergence speed, and increase the accuracy of matching the final set equalizer parameters with user preference data.

It should be understood that the above general description and the detailed description that follows are exemplary and explanatory only and are not intended to limit this application.

BRIEF DESCRIPTION OF THE DRAWINGS

To provide a clearer explanation of the technical solutions in the examples of this application, the drawings used in the description of the examples will be briefly introduced below. It is evident that the drawings described below are only some examples of this application, and for those of ordinary skill in the art, other drawings can be obtained based on these drawings without creative efforts.

FIG. 1 is a flowchart illustrating an example method of setting the equalizer parameter according to one or more aspects of this application;

FIG. 3 is a detailed flowchart of step S142 in FIG. 2;

FIG. 5 is a detailed flowchart of step S12 in FIG. 1;

BRIEF DESCRIPTION

To better enable those skilled in the art to understand the technical solutions provided in this application, the following is a further detailed description of the equalizer parameter setting method, audio system, device, and readable storage medium provided by this application, in conjunction with the drawings and specific examples. It should be understood that the examples described are only part of the examples of this application, and not all examples. All other examples obtained by those skilled in the art without creative efforts based on the examples in this application fall within the scope of protection of this application.

The terms "first," "second," and the like in this application are used to distinguish different objects, not to describe a specific order. In addition, the terms "comprising" and "having," as well as any of their variations, are intended to cover non-exclusive inclusions. For example, a process, method, system, product or device that comprises a series of steps or units is not limited to the steps or units listed but may optionally comprise steps or units not listed, or may optionally comprise other steps or units inherent to these processes, methods, products or devices.

This application provides a method for setting one or more equalizer parameters to address the problem in the existing technology where users find it difficult to accurately and quickly set equalizer parameters that correspond to their personal preferences. FIG. 1 shows a flowchart illustrating an example of an equalizer parameter setting method provided by this application.

An executing body (e.g., a device) of the equalizer parameter setting method in this application can be an audio system. For example, the equalizer parameter setting method can be executed (e.g., performed) by a terminal equipment, a server, or other processing devices. The audio system may comprise user equipments (UEs), mobile devices, user terminals, terminals, cellular phones, wireless phones, personal digital assistants (PDAs), handheld devices, computing devices, in-vehicle devices, wearable devices, etc. In some possible implementations, the equalizer parameter setting method can be realized by a processor invoking non-transitory computer-readable instructions stored in a memory.

Figure 6:
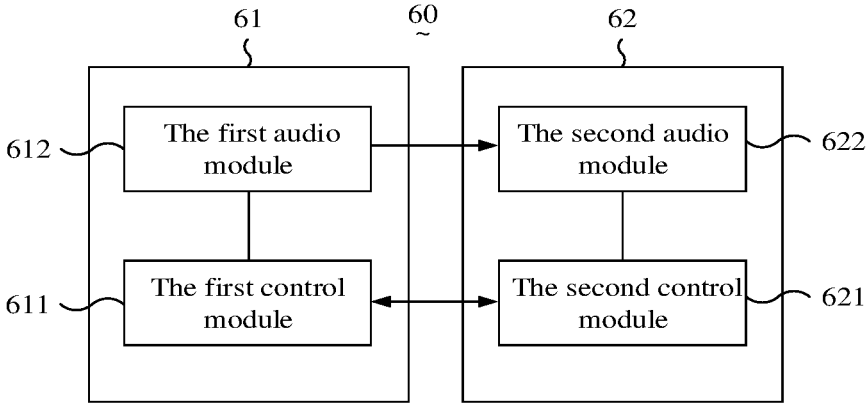
FIG. 6 is a structural diagram of an example audio system according to one or more aspects of this application.

Specifically, the executing body of the equalizer parameter setting method in this example is an audio system. Please refer further to FIG. 6, which is a structural diagram illustrating an example audio system in this application. As shown in FIG. 6, the audio system 60 comprises a communication device 61 and an audio device 62. The communication device 61 comprises a first control module 611 and a first audio module 612. The audio device 62 comprises a second control module 621 and a second audio module 622.

Specifically, in this example, the communication device 61 can be a mobile phone, a tablet, or a computing device, etc., and the audio device 62 can be a Bluetooth headset (such as a headphone or an earphone), or a speaker, etc. Moreover, the communication device 61 and the audio device 62 are connected via Bluetooth to achieve signal transmission. Although not depicted in FIG. 6, the communication device 61 may receive input such as equalizer curves that correspond to equalizer parameters of a plurality of dimensions. The audio device 62 may be configured to set the equalizer parameters and output audio signals.

The first control module 611 communicates with the second control module 621 via SPP (Serial Port Profile) or BLE (Bluetooth Low Energy), and the first audio module 612 communicates with the second audio module 622 via the A2DP (Advanced Audio Distribution Profile) protocol.

The first control module 611 is responsible for controlling the first audio module 612 to send audio signals to the audio device 62, enabling the second audio module 622 to play corresponding music based on the audio signal; the first control module 611 is also responsible for sending an equalizer parameter curve to the second control module 621, so that the second control module 621 can set the equalizer parameters of the audio device 62 based on the equalizer parameter curve.

The equalizer parameter setting method of this example is based on the Particle Swarm Optimization (PSO) algorithm and can quickly set equalizer parameters that match personal preferences through multiple rounds of test interactions.

The Particle Swarm Optimization algorithm is inspired by the foraging behavior of birds and is a type of swarm intelligence evolutionary algorithm. It moves individuals within the group to better regions based on their adaptability to the environment. However, it does not use evolutionary operators on individuals; instead, each individual is considered as a volume-less particle (point) in a D-dimensional search space. The particles fly through the search space at a certain velocity, which is dynamically adjusted based on their own flying experience and that of their companions.

Specifically, as shown in FIG. 1, the equalizer parameter setting method of this disclosed example may comprise the following steps:

Step S11: Obtain the initial equalizer population.

In this example, the initial equalizer population comprises multiple equalizer curves, each equalizer curve comprising multiple dimensions of equalizer parameters, that is, there are multiple dimensions of search space. Specifically, each equalizer curve in this example can be considered as a particle. The acquisition of the initial equalizer population can be obtained by the first control module 611.

Optionally, each equalizer curve comprises twenty dimensions, that is, there is a twenty-dimensional search space; or, each equalizer curve comprises eight dimensions, that is, there is an eight-dimensional search space.

In particular, the initial equalizer population of this example can be randomly generated; or it can be selected from a database of past user usage, where the data stored in the database can be parameters set by the user themselves when using other similar products.

Step S12: Obtain the first and second equalizer curves from the initial equalizer population.

The initial equalizer population comprises multiple equalizer curves, and two equalizer curves are randomly selected from the multiple equalizer curves, which are the aforementioned first and second equalizer curves. The acquisition of the first and second equalizer curves can be obtained by the first control module 611.

Specifically, to increase the differentiation, the similarity between the two randomly selected equalizer curves needs to be less than a preset threshold. Therefore, it is necessary to determine the similarity of the two randomly selected equalizer curves to determine the corresponding first and second equalizer curves.

Optionally, the specific steps for obtaining the first and second equalizer curves from the initial equalizer population can be further referred to in FIG. 5, which is a schematic flow diagram of step S12 in FIG. 1. Specifically, it comprises the following steps:

Step S21: Determine the similarity matrix based on cosine similarity.

In this example, a similarity matrix needs to be predefined to calculate the corresponding similarity between the first equalizer curve and the second equalizer curve based on the similarity matrix. Specifically, this example determines the similarity matrix according to cosine similarity. The similarity matrix is specifically shown as follows:

$$\text{similarity} = \cos(\theta) = \frac{A \cdot B}{\|A\|\|B\|} = \frac{\sum_{i=1}^{n} A_i \times B_i}{\sqrt{\sum_{i=1}^{n} (A_i)^2} \times \sqrt{\sum_{i=1}^{n} (B_i)^2}}$$

Where, A represents the first vector (one of the first and second equalizer curves), B represents the second vector (the other of the first and second equalizer curves), $\cdot$ represents the dot product, $\|A\|$ is the vector length of the first vector, and $\|B\|$ is the vector length of the second vector.

Specifically, the range of the similarity matrix is from $-1$ to 1, where $-1$ indicates that the directions of the two vectors (equalizer curves) are exactly opposite, 1 indicates that the directions of the two vectors (equalizer curves) are exactly the same, 0 indicates that the two vectors (equalizer curves) are independent of each other, and values in between indicate intermediate levels of similarity or dissimilarity. Therefore, the preset threshold value set in this example is greater than zero and less than 1.

Step S22: Input any two equalizer curves from the initial equalizer population into the similarity matrix to obtain the similarity between any two equalizer curves.

In this example, the first control module 611 inputs any two equalizer curves from the initial equalizer population into the similarity matrix to calculate the similarity between the aforementioned two equalizer curves using the similarity matrix.

Step S23: Based on the similarity between any two equalizer curves being less than the preset threshold, determine any two equalizer curves as the first equalizer curve and the second equalizer curve.

Wherein, when it is determined in step S22 that the calculated similarity is less than the preset threshold, it can be confirmed that the aforementioned any two equalizer curves have a certain degree of dissimilarity, but the dissimilarity between the two equalizer curves is not too great, so that in the subsequent selection of corresponding equalizer curves for iteration, it does not lead to a selection of iteratively equalizer curves with too great a difference, and it is possible to select equalizer parameters from similar equalizer parameters that match the user preference data more closely.

The preset threshold value in this example can be a fixed constant; or, the preset threshold value in this example can change with the number of iterations of the equalizer curve selection, specifically decreasing with each iteration.

Optionally, when it is determined in step S22 that the calculated similarity is greater than or equal to the preset threshold, then further execute step S24.

Step S24: Based on the similarity between any two equalizer curves being greater than or equal to a preset threshold, iterate to search and initialize the equalizer population to obtain a new first equalizer curve and a second equalizer curve, so that the similarity between the new first equalizer curve and the second equalizer curve is less than the preset threshold.

When the similarity is judged to be greater than or equal to the preset threshold, it indicates that the similarity between the two equalizer curves is too high, making it difficult to distinguish between the first and second equalizer curves. Therefore, the first control module 611 further searches and initializes the equalizer population to obtain new first and second equalizer curves, and calculates the similarity between the new curves until the similarity between the new first and second equalizer curves is less than the preset threshold.

Furthermore, after completing step S23, or after completing step S24, the first audio module 612 further sends the first and second equalizer curves to the second audio module 622. The second audio module 622 receives the first and second equalizer curves to further execute step S13.

Step S13: Based on user preference data, determine whether the first equalizer curve or the second equalizer curve is the target equalizer curve.

The second control module 621 of this example compares the first and second equalizer curves based on user preference data to determine the target equalizer curve. Optionally, step S13 can be selected by the user wearing the audio device 62 according to personal preference.

Step S14: Based on the target equalizer curve, obtain iterative equalizer population to acquire the iterative target equalizer curve.

After the second control module 621 selects the corresponding target equalizer curve in step S13, it further sends it to the first control module 611, which communicates with the second control module 621. The first control module 611 obtains the target equalizer curve through the second control module 621 to obtain the iterative equalizer population based on the target equalizer curve, that is, to update the corresponding iterative equalizer population.

Figure 2:
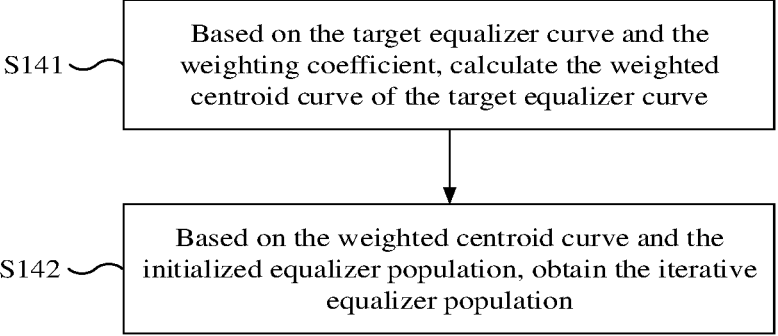
FIG. 2 is a detailed flowchart of step S14 in FIG. 1.

Optionally, for the specific process of obtaining the iterative equalizer population based on the target equalizer curve, please refer to FIG. 2. FIG. 2 is a schematic flow diagram of step S14 in FIG. 1. Specifically, it comprises the following steps:

Step S141: Based on the target equalizer curve and the weighting coefficient, calculate the weighted centroid curve of the target equalizer curve.

In this example, the expression for the weighted centroid curve can be shown as follows:

$$G\_best = \frac{1}{n}\sum_{i=1}^{n} ki * p\_better(i).$$

Here, p_better(i) refers to the target equalizer curve selected in the ith iteration, and ki refers to the weighting coefficient.

Step S142: Based on the weighted centroid curve and the initial equalizer population, obtain the iterative equalizer population.

In this example, the first control module 611 updates the initial equalizer population based on the weighted centroid curve calculated in step S141 to obtain a new iterative equalizer population, and then performs iterative selection based on the new iterative equalizer population.

Optionally, for the specific process of obtaining the iterative equalizer population based on the weighted centroid curve and the initial equalizer population, please continue to refer to FIG. 3, which is a schematic diagram of the specific process of step S142 in FIG. 2. Specifically, it comprises the following steps:

Step S1421: Based on the target equalizer curve and the initial equalizer population, obtain the first parameter.

In this example, the first parameter comprises all the differences between the target equalizer curve and the remaining equalizer curves in the initial equalizer population.

Step S1422: Based on the weighted centroid curve and the initial equalizer population, obtain the second parameter.

In this example, the second parameter comprises all the differences between the weighted centroid curve and the remaining equalizer curves in the initial equalizer population.

Step S1423: Based on the first parameter, the second parameter, the first sampling step size, the second sampling step size, the inertia weight, and the initial velocity, calculate the iterative velocity.

The expression for the iterative speed in this example can be shown as follows:

$$v_{i+1} = v_i * w + c_1 * R_1 * (p\_better - p(gd)) + c_2 * R_2 * (G\_best - p(gd))$$

In this, (p_better-p(gd)) is the first parameter, specifically calculated in step S1421; (G_better-p(gd)) is the second parameter, specifically calculated in step S1422; p_better is the target equalizer curve; p(gd) is any other equalizer curve in the initial equalizer population; G_best is the weighted centroid curve; R1 is the first sampling step size, R2 is the second sampling step size, where the first and second sampling step sizes are two random values varying within the range [0, 1]; c1 and c2 are acceleration constants; vi is the initial velocity; w is the inertia weight.

Step S1424: Based on the iterative velocity and the initial equalizer population, obtain the iterative equalizer population.

In this example, the expression for the iterative equalizer population can be shown as follows:

$$p_{i+1} = p_i + v_{i+1}$$

Wherein, pi+1 is the new iterative equalizer population; pi is the iterative equalizer population before the update, specifically, during the second iteration update, it is the initial equalizer population; vi+1 is the iterative velocity calculated by the first control module 611 according to step S1423.

Furthermore, after the first control module 611 obtains the iterative equalizer population based on the target equalizer curve, that is, after updating the corresponding iterative equalizer population, it further obtains the iterative target equalizer curve from the iterative equalizer population. The steps for obtaining the iterative target equalizer curve from the iterative equalizer population can be as described in steps 11 to S13, which are not repeated here.

Step S15: When the number of iterations reaches the preset number, obtain the final iterative target equalizer curve and set the corresponding equalizer parameters based on the final iterative target equalizer curve.

After multiple rounds of iterative selection, that is, when the number of iterations reaches a preset number or value, the second control module 621 obtains the final iterative target equalizer curve and sets the corresponding equalizer parameters based on the final iterative target equalizer curve, that is, sets the equalizer parameters of the audio device 62. Optionally, the preset number of iterations in this example can be 4-12 times, specifically 5-7 times.

Figure 4:
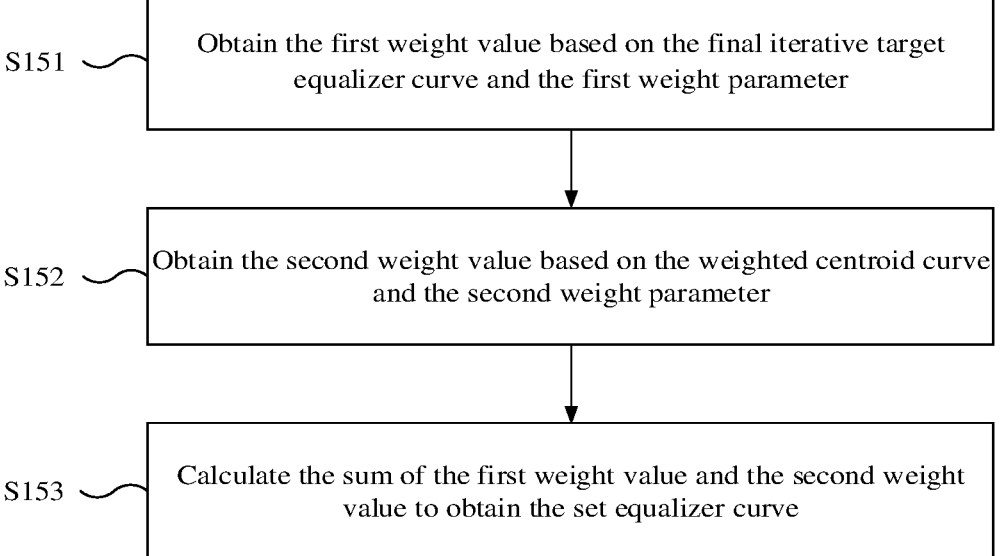
FIG. 4 is a detailed flowchart of step S15 in FIG. 1.

Optionally, for the specific process of setting the corresponding equalizer parameters based on the final iterative target equalizer curve, please continue to refer to FIG. 4, which is a schematic flow diagram of step S15 in FIG. 1. Specifically, it comprises the following steps:

Step S151: Obtain the first weight value based on the final iterative target equalizer curve and the first weight parameter.

Step S152: Obtain the second weight value based on the weighted centroid curve and the second weight parameter.

Step S153: Calculate the sum of the first weight value and the second weight value to obtain the set equalizer curve.

Wherein, the expression for the set equalizer curve in this example can be shown as follows:

$$last\_position = \alpha \times p\_better(i) + (1 - \alpha) \times G\_best$$

In this, p_better(i) is the final iterative target equalizer curve, $\alpha$ is the first weight parameter, G_best is the weighted centroid curve, and (1-$\alpha$) is the second weight parameter. From the above formula, it can be known that the sum of the first weight parameter and the second weight parameter is 1. Optionally, the range of the first weight parameter can be 0.4-0.6.

Specifically, all the equalizer parameters in the set equalizer curve calculated according to step S153 are the corresponding equalizer parameters. In this case, the second control module 621 sets the equalizer parameters of the audio device 62 based on the equalizer parameters of the set equalizer curve.

This application is based on the iterative selection of the initial equalizer population and iteratively updates the equalizer population to output the final iterative target equalizer curve when the number of iterations reaches a preset threshold. Based on the final iterative target equalizer curve, the corresponding equalizer parameters are set. Using a group evolutionary strategy, it is possible to reduce the search space range, increase the convergence speed, and improve the accuracy of matching the final set equalizer parameters with user preference data.

At the same time, the equalizer parameter setting method of this application communicates and interacts with the communication device 61 and the audio device 62, allowing users to choose the corresponding equalizer curve according to personal preferences. Through simple human-machine interaction, the correct setting of the equalizer parameters of the audio device 62 can be achieved, reducing the difficulty for individual users, especially non-professional users, in setting equalizer parameters. The setting method is simple and interesting, enhancing the fun of setting equalizer parameters.

Figure 7:
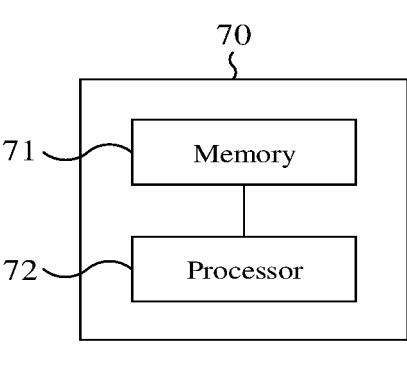
FIG. 7 is a framework diagram of an example electronic device according to one or more aspects of this application.

This application also provides an electronic device (e.g., a computing device), please refer to FIG. 7, FIG. 7 is a schematic diagram of the framework of an example of the electronic device (e.g., a computing device) of this application. The electronic device 70 comprises a memory 71 and a processor 72 that are coupled to each other. The processor 72 is used to execute the program instructions stored in the memory 71 to implement the steps in any of the equalizer parameter setting method examples described above. In a specific implementation scenario, the electronic device 70 may comprise, but is not limited to, a microcomputer, server, and the electronic device 70 may also comprise mobile devices such as laptops, tablet computers, computing devices, etc., without limitation.

Specifically, the processor 72 is used to control itself and the memory 71 to implement the steps in any of the equalizer parameter setting method examples described above. The processor 72 can also be referred to as a CPU (Central Processing Unit). The processor 72 may be an integrated circuit chip with signal processing capabilities. The processor 72 can also be a general-purpose processor, a digital signal processor (DSP), an application-specific integrated circuit (ASIC), a field-programmable gate array (FPGA), or other programmable logic devices, discrete gate or transistor logic devices, discrete hardware components. The general processor can be a microprocessor, or the processor can also be any conventional processor, etc. In addition, the processor 72 can be realized by integrated circuit chips together.

Figure 8:
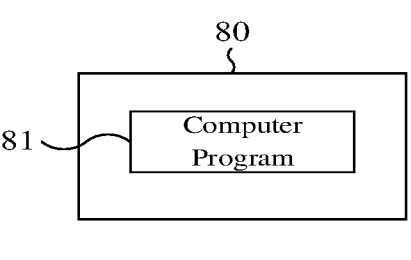
FIG. 8 is a framework diagram of an example computer-readable storage medium according to one or more aspects of this application.

This application also provides a computer-readable storage medium, please refer to FIG. 8, FIG. 8 is a schematic diagram of the framework of an example of the computer-readable storage medium of this application. The computer-readable storage medium 80 stores a computer program 81 that can be run by a processor, and the computer program 81 is used to implement the steps in any of the equalizer parameter setting method examples described above.

In some examples, the apparatus provided in this public example can have functions or include modules that are used to perform the methods described in the method examples above. The specific implementation can refer to the description of the method examples above. For brevity, this is not repeated here.

The descriptions of the various examples above tend to emphasize the differences between the examples, and their similarities or like aspects can be referred to each other. For brevity, this is not repeated here.

In the several examples provided in this application, it should be understood that the disclosed methods and apparatus can be implemented in other ways. For example, the described apparatus examples are merely illustrative. For instance, the division of modules or units is just a logical functional division. In actual implementation, there can be other division methods. For example, units or components can be combined or integrated into another system, or some features can be omitted or not executed. Another point is that the coupling or direct coupling or communication connection discussed or shown between each other can be through some interfaces, devices, or units' indirect coupling or communication connection, which can be electrical, mechanical, or other forms.

Furthermore, in each example of this application, each functional unit can be integrated into a processing unit, or they can physically exist separately, or two or more units can be integrated into one unit. The integrated unit can be implemented in the form of hardware or in the form of software functional units.

If the integrated unit is implemented as a software functional unit and sold or used as an independent product, it can be stored in a computer-readable storage medium. Based on such an understanding, the essence of the technical solution of this application or the part that contributes to the prior art or the entire or part of the technical solution can be reflected in the form of a software product. This computer software product is stored in a storage medium, including several instructions to enable a computing device (which can be a personal computer, server, or network device, etc.) or a processor to execute all or part of the steps of the various examples of the methods of this application. The aforementioned storage medium includes various media that can store program code, such as USB flash drives, mobile hard drives, read-only memory (ROM), random access memory (RAM), magnetic disks, or optical disks, etc.

The above are only examples of this application and do not limit the patent scope of this application. Any equivalent structure or equivalent process transformation made using the contents of the specification and drawings of this application, or directly or indirectly applied in other related technical fields, are similarly included within the patent protection scope of this application.

What is claimed is:

1. A method for setting equalizer parameters, comprising:
receiving, by a computing device, an initial equalizer population comprising a plurality of equalizer curves, wherein the plurality of equalizer curves correspond to equalizer parameters of a plurality of dimensions;
executing a process of iteratively selecting, from the plurality of equalizer curves, a first equalizer curve and a second equalizer curve until a final iterative target equalizer curve is determined, wherein a similarity between the first equalizer curve and the second equalizer curve is less than a preset threshold;
receiving, by the computing device and from an audio device associated with a user, a user input comprising a selection of the first equalizer curve or the second equalizer curve as a target equalizer curve, wherein the selection is based on user preference data captured by the audio device;
determining, based on the target equalizer curve, an iterative equalizer population;
generating, based on the iterative equalizer population, an iterative target equalizer curve;
after determine that a number of iterations reaches a preset value, generating the final iterative target equalizer curve;
configuring, by the computing device and based on the final iterative target equalizer curve, the audio device to set the corresponding equalizer parameters; and
causing, by the computing device and based on the corresponding equalizer parameters, the audio device to output an audio signal customized for the user.

2. The method for setting the equalizer parameters according to claim 1, wherein determining the iterative equalizer population comprises:
determining, based on the target equalizer curve and a weighting coefficient, a weighted centroid curve of the target equalizer curve; and
determining, based on the weighted centroid curve and the initial equalizer population, the iterative equalizer population.

3. The method for setting the equalizer parameters according to claim 2, wherein determining the iterative equalizer population further comprises:
determining, based on the target equalizer curve and the initial equalizer population, a first parameter, wherein the first parameter comprises differences between the target equalizer curve and remaining equalizer curves in the initial equalizer population;
determining, based on the weighted centroid curve and the initial equalizer population, a second parameter, wherein the second parameter comprises differences between the weighted centroid curve and remaining equalizer curves in the initial equalizer population;
determining, based on the first parameter, the second parameter, a first sampling step size, a second sampling step size, an inertia weight, and an initial velocity, an iterative velocity; and
determining, based on the iterative velocity and the initial equalizer population, the iterative equalizer population.

4. The method for setting the equalizer parameters according to claim 2, wherein causing the audio device to set the corresponding equalizer parameters comprises:
determining, based on the final iterative target equalizer curve and a first weight parameter, a first weight value;
determining, based on the weighted centroid curve and a second weight parameter, a second weight value, wherein a sum of the first weight parameter and the second weight parameter is equal to one; and
determining, based on the sum of the first weight value and the second weight value, a set equalizer curve, wherein equalizer parameters in the set equalizer curve comprise the corresponding equalizer parameters in the final iterative target equalizer curve.

5. The method for setting the equalizer parameters according to claim 1, wherein interactively selecting the first equalizer curve and the second equalizer curve comprises:
determining, based on cosine similarity, a similarity matrix;
inputting any two equalizer curves from the initial equalizer population into the similarity matrix to obtain a similarity between the two equalizer curves; and
based on the similarity between the two equalizer curves being less than the preset threshold, identifying the two equalizer curves as the first equalizer curve and the second equalizer curve.

6. The method for setting the equalizer parameters according to claim 1, wherein the preset value is between 4-12.

7. The method for setting the equalizer parameters according to claim 1, wherein the preset threshold is progressively reduced based on the number of iterations, or the preset threshold is a fixed constant that is greater than zero and less than one.

8. An electronic device, comprising:
one or more processors; and
memory storing instructions that, when executed by the one or more processors, cause the electronic device to perform the steps in claim 1.

9. An audio system comprising:
a computing device comprising a first control module and a first audio module; and
an audio device comprising a second control module and a second audio module;
wherein the first control module is configured to:
receive an initial equalizer population comprising a plurality of equalizer curves, wherein the plurality of equalizer curves correspond to equalizer parameters of a plurality of dimensions;

execute a process to iteratively select, from the plurality of equalizer curves, a first equalizer curve and a second equalizer curve from the plurality of equalizer curves, to determine an iterative target equalizer curve, wherein a similarity between the first equalizer curve and the second equalizer curve is less than a preset threshold;

receive, from the second control module of the audio device associated with a user, a user input comprising a selection of the first equalizer curve or the second equalizer curve as a target equalizer curve, wherein the selection is based on user preference data captured by the audio device;

determine, based on the target equalizer curve, an iterative equalizer population;

generate, based on the iterative equalizer population, the iterative target equalizer curve; and after determining that a number of iterations reaches a preset value, cause the second control module to set, based on a final iterative target equalizer curve, the corresponding equalizer parameters on the audio device; and cause, based on the corresponding equalizer parameters, the second control module to control the audio device to output an audio signal customized for the user.

10. An audio device comprising:

one or more processors; and memory storing instructions that, when executed by the one or more processors, cause the audio device to:

receive, from a computing device, a first equalizer curve and a second equalizer curve, wherein a similarity between the first equalizer curve and the second equalizer curve is less than a preset threshold, and wherein the first equalizer curve and the second equalizer curve are iteratively selected, from a plurality of equalizer curves associated with an initial equalizer population, until a final iterative target equalizer curve is determined, and wherein the plurality of equalizer curves correspond to equalizer parameters of a plurality of dimensions;

select, based on user preference data captured by the audio device and associated with a user, the first equalizer curve or the second equalizer curve as a target equalizer curve;

send, to the computing device, the selection of the first equalizer curve or the second equalizer curve as the target equalizer curve;

receive, from the computing device and after a determination that a number of iterations reaches a preset value, the final iterative target equalizer curve determined based on an iterative equalizer population, wherein the iterative equalizer population is determined based on the target equalizer curve;

set, based on the final iterative target equalizer curve, the corresponding equalizer parameters; and output, based on the corresponding equalizer parameters, an audio signal customized for the user.

11. The audio device according to claim 10, wherein the instructions, when executed by the one or more processors, cause the audio device to set the corresponding equalizer parameters by:

determining, based on the final iterative target equalizer curve and a first weight parameter, a first weight value;

determining, based on a weighted centroid curve and a second weight parameter, a second weight value, wherein a sum of the first weight parameter and the second weight parameter is equal to one; and determining, based on the sum of the first weight value and the second weight value, a set equalizer curve, wherein the equalizer parameters in the set equalizer curve comprise the corresponding equalizer parameters in the final iterative target equalizer curve.

12. The audio device according to claim 10, wherein the iterative equalizer population is determined based on a weighted centroid curve of the target equalizer curve and the initial equalizer population, and wherein the weighted centroid curve of the target equalizer curve is determined based on the target equalizer curve and a weighting coefficient.

13. The audio device according to claim 12, wherein the iterative equalizer population is further determined based on an iterative velocity and the initial equalizer population, wherein the iterative velocity is determined by:

determining, based on the target equalizer curve and the initial equalizer population, a first parameter, wherein the first parameter comprises differences between the target equalizer curve and remaining equalizer curves in the initial equalizer population;

determining, based on the weighted centroid curve and the initial equalizer population, a second parameter, wherein the second parameter comprises differences between the weighted centroid curve and remaining equalizer curves in the initial equalizer population; and determining, based on the first parameter, the second parameter, a first sampling step size, a second sampling step size, an inertia weight, and an initial velocity.

14. The audio device according to claim 10, wherein the preset value is between 4-12.

15. The audio device according to claim 10, wherein the preset threshold is progressively reduced based on the number of iterations, or the preset threshold is a fixed constant that is greater than zero and less than one.

16. One or more non-transitory computer-readable media storing instructions that, when executed by one or more processors, cause a computing device to:

receive an initial equalizer population comprising a plurality of equalizer curves, wherein the plurality of equalizer curves correspond to equalizer parameters of a plurality of dimensions;

execute a process to iteratively select, from the plurality of equalizer curves, a first equalizer curve and a second equalizer curve until a final iterative target equalizer curve is determined, wherein a similarity between the first equalizer curve and the second equalizer curve is less than a preset threshold;

receive, from an audio device associated with a user, a user input comprising a selection of the first equalizer curve or the second equalizer curve as a target equalizer curve, wherein the selection is based on user preference data captured by the audio device;

determine, based on the target equalizer curve, an iterative equalizer population;

generate, based on the iterative equalizer population, an iterative target equalizer curve;

after determining that a number of iterations reaches a preset value, generate the final iterative target equalizer curve;

configure, based on the final iterative target equalizer curve, the audio device to set the corresponding equalizer parameters; and cause, based on the corresponding equalizer parameters, the audio device to output an audio signal customized for the user.

17. The computer-readable media according to claim 16, wherein the instructions, when executed by the one or more processors, cause the computing device to determine the iterative equalizer population by:

determining, based on the target equalizer curve and a weighting coefficient, a weighted centroid curve of the target equalizer curve; and determining, based on the weighted centroid curve and the initial equalizer population, the iterative equalizer population.

18. The computer-readable media according to claim 17, wherein the instructions, when executed by the one or more processors, cause the computing device to determine the iterative equalizer population by:

determining, based on the target equalizer curve and the initial equalizer population, a first parameter, wherein the first parameter comprises differences between the target equalizer curve and remaining equalizer curves in the initial equalizer population;

determining, based on the weighted centroid curve and the initial equalizer population, a second parameter, wherein the second parameter comprises differences between the weighted centroid curve and remaining equalizer curves in the initial equalizer population;

determining, based on the first parameter, the second parameter, a first sampling step size, a second sampling step size, an inertia weight, and an initial velocity, an iterative velocity; and determining, based on the iterative velocity and the initial equalizer population, the iterative equalizer population.

19. The computer-readable media according to claim 17, wherein the instructions, when executed by the one or more processors, cause the computing device to cause the audio device to set the corresponding equalizer parameters by:

determining, based on the final iterative target equalizer curve and a first weight parameter, a first weight value;

determining, based on the weighted centroid curve and a second weight parameter, a second weight value, wherein a sum of the first weight parameter and the second weight parameter is equal to one; and determining, based on the sum of the first weight value and the second weight value, a set equalizer curve, wherein the equalizer parameters in the set equalizer curve comprise the corresponding equalizer parameters in the final iterative target equalizer curve.

20. The computer-readable media according to claim 16, wherein the instructions, when executed by the one or more processors, cause the computing device to interactively select the first equalizer curve and the second equalizer curve by:

determining, based on cosine similarity, a similarity matrix;

inputting any two equalizer curves from the initial equalizer population into the similarity matrix to obtain a similarity between the two equalizer curves; and based on the similarity between the two equalizer curves being less than the preset threshold, identifying the two equalizer curves as the first equalizer curve and the second equalizer curve.

\*   \*   \*   \*   \*